United States Patent
Lin et al.

(10) Patent No.: US 8,969,870 B2
(45) Date of Patent: Mar. 3, 2015

(54) PATTERN FOR ULTRA-HIGH VOLTAGE SEMICONDUCTOR DEVICE MANUFACTURING AND PROCESS MONITORING

(71) Applicant: Macronix International Co., Ltd., Hsin-Chu (TW)

(72) Inventors: Chen-Yuan Lin, Taitung (TW); Ching-Lin Chan, Huwei Township (TW); Cheng-Chi Lin, Toucheng Township (TW); Shih-Chin Lien, Sinjhuang (TW)

(73) Assignee: Macronix International Co., Ltd., Hsin-Chu (TW)

( * ) Notice: Subject to any disclaimer, the term of this patent is extended or adjusted under 35 U.S.C. 154(b) by 116 days.

(21) Appl. No.: 13/886,656

(22) Filed: May 3, 2013

(65) Prior Publication Data

US 2014/0264336 A1    Sep. 18, 2014

Related U.S. Application Data

(60) Provisional application No. 61/776,831, filed on Mar. 12, 2013.

(51) Int. Cl.
*H01L 23/58*    (2006.01)
*G03F 1/00*    (2012.01)
*H01L 21/66*    (2006.01)

(52) U.S. Cl.
CPC .............. *H01L 22/34* (2013.01); *H01L 22/12* (2013.01)
USPC ................................. 257/48; 438/18; 430/5

(58) Field of Classification Search
USPC ............................................. 257/48; 438/18
See application file for complete search history.

(56) References Cited

U.S. PATENT DOCUMENTS 7,803,644 B2 * 9/2010 Balch et al. ............... 438/18
2009/0068772 A1 * 3/2009 Balch et al. ............... 438/18

* cited by examiner

*Primary Examiner* — Lex Malsawma
(74) *Attorney, Agent, or Firm* — Alston & Bird LLP (57) ABSTRACT

A pattern for use in the manufacture of semiconductor devices is provided which, according to an example embodiment, may comprise at least one second field region comprising a main array of dies, each having a height of $Y_1$ and a width of $X_1$, and the main array having a height of $Y_3$. The pattern according to the example embodiment may further include at least one first field region comprising a monitoring region having a height of $Y_2$ and a width of $X_2$ and an auxiliary die region having a height of $Y_2$ and comprising an auxiliary array of dies. The dimensions of the various regions may be proportional to one another, such that $X_2 = n_1 \times X_1 + \text{adjustment}_1$, $Y_2 = n_3 \times Y_1 + \text{adjustment}_3$, and $Y_3 = n_4 \times Y_2 + \text{adjustment}_4$, $n_1$, $n_3$, and $n_4$ being integers.

20 Claims, 11 Drawing Sheets

PATTERN FOR ULTRA-HIGH VOLTAGE SEMICONDUCTOR DEVICE MANUFACTURING AND PROCESS MONITORING

CROSS-REFERENCE TO RELATED APPLICATION

This application claims priority to U.S. Provisional Application No. 61/776,831 filed Mar. 12, 2013, which is hereby incorporated in its entirety by reference.

TECHNOLOGICAL FIELD

Embodiments of the present invention generally relate to the manufacture of semiconductor devices and, more particularly, relate to a new pattern which enables process monitoring and can be used in the manufacture of semiconductor devices.

BACKGROUND

There is currently increasing demand for ultra-high voltage (UHV) semiconductor devices. The process for manufacturing UHV devices can introduce some complications or difficulties over existing low-voltage (LV) manufacturing techniques. Process monitoring, for example, can be more difficult to implement into the UHV manufacturing process than the LV manufacturing process.

During LV manufacturing processes, monitoring devices may be placed on the scribe lines between dies. However, the monitoring devices used in UHV manufacturing processes are ordinarily too large to fit on scribe lines. Moreover, placing the monitoring devices in other locations may decrease chip yield.

BRIEF SUMMARY OF EXEMPLARY EMBODIMENTS

Some example embodiments are therefore directed to a new pattern for ultra-high voltage semiconductor device manufacturing. The pattern may provide a second field region which includes a main array of dies and a first field region which comprises a monitoring device region and an auxiliary die region which includes an auxiliary array of dies. The height of the second field region may be divisible by the height of the monitoring region, which may allow for efficient configurations when various embodiments of the pattern are applied over the surface of a wafer. The pattern may, for example, be embodied in a photomask for use in a photolithographic semiconductor manufacturing process.

Thus, according to one exemplary embodiment, a semiconductor device is provided ("exemplary" as used herein referring to "serving as an example, instance or illustration"), the semiconductor device including at least one second field region comprising a main array of dies, each die having a height of $Y_1$ and a width of $X_1$, and the main array having a height of $Y_3$. The semiconductor device according to the exemplary embodiment further includes at least one first field region comprising a monitoring region having a height of $Y_2$ and a width of $X_2$ and an auxiliary die region having a height of $Y_2$ and comprising an auxiliary array of dies. The dimensions of the various regions may be related by the following equations: $X_2 = n_1 \times X_1 + \text{adjustment}_1$, $Y_2 = n_3 \times Y_1 + \text{adjustment}_3$, and $Y_3 = n_4 \times Y_2 + \text{adjustment}_4$, with $n_1$, $n_3$, and $n_4$ being integers.

According to a further embodiment, a photomask configured to be used during a photolithographic semiconductor manufacturing process is provided, the photomask being further configured to cause projection of at least one second field region comprising a main array of dies, each die having a height of $Y_1$ and a width of $X_1$, and the main array having a height of $Y_3$. The photomask according to the exemplary embodiment is further configured to cause projection of at least one first field region comprising a monitoring region having a height of $Y_2$ and a width of $X_2$ and an auxiliary die region having a height of $Y_2$ and comprising an auxiliary array of dies. The dimensions of the various regions may be related by the following equations: $X_2 = n_1 \times X_1 + \text{adjustment}_1$, $Y_2 = n_3 \times Y_1 + \text{adjustment}_3$, and $Y_3 = n_4 \times Y_2 + \text{adjustment}_4$, with $n_1$, $n_3$, and $n_4$ being integers.

In another exemplary embodiment, a method for manufacturing a semiconductor device is provided which includes applying light in a particular pattern to at least a portion of a substrate. The particular pattern according to the exemplary embodiment includes at least one second field region comprising a main array of dies, each die having a height of $Y_1$ and a width of $X_1$, and the main array having a height of $Y_3$. The particular pattern further includes at least one first field region comprising a monitoring region having a height of $Y_2$ and a width of $X_2$ and an auxiliary die region having a height of $Y_2$ and comprising an auxiliary array of dies. The dimensions of the various regions may be related by the following equations: $X_2 = n_1 \times X_1 + \text{adjustment}_1$, $Y_2 = n_3 \times Y_1 + \text{adjustment}_3$, and $Y_3 = n_4 \times Y_2 + \text{adjustment}_4$, with $n_1$, $n_3$, and $n_4$ being integers.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some example embodiments of the present invention will now be described more fully hereinafter with reference to the accompanying drawings, in which some, but not all embodiments of the invention are shown. Indeed, various example embodiments of the invention may be embodied in many different forms and should not be construed as limited to the example embodiments set forth herein; rather, these example embodiments are provided so that this disclosure will satisfy applicable legal requirements.

Some example embodiments are therefore directed to new patterns for semiconductor device manufacturing. Patterns according to various example embodiments may provide a second field region which includes a main array of dies and a first field region which comprises a monitor region and an auxiliary die region which includes an auxiliary array of dies. The height of the second field region may be divisible by the height of the monitoring region, which may allow for efficient configurations when various embodiments of the pattern are applied over the surface of a wafer. Patterns according to some example embodiments may, for example, be embodied in a photomask for use in a photolithographic manufacturing process. Thus, for example, photomasks according to example embodiments may be configured to cause the described patterns to be projected on a semiconductor wafer as part of a photolithographic semiconductor manufacturing process. Patterns provided according to example embodiments of the present invention may be utilized, for example, in the manufacture of ultra-high voltage (UHV) semiconductor devices. However, embodiments of the present invention may also be utilized in the manufacture of other types of semiconductor devices, and may, for example, be beneficially employed in contexts in which a monitoring device is too large to be situated within scribe lines.

It will be understood that, as used herein, references to a "height" refer to measurements made in a first direction in a plane of a reference object, such as in a plane of a photomask, semiconductor substrate, wafer surface, etc. Similarly, references to a "width" refer to measurements made in a second direction in the plane of the reference object, the second direction being orthogonal to the first.

Figure 1:
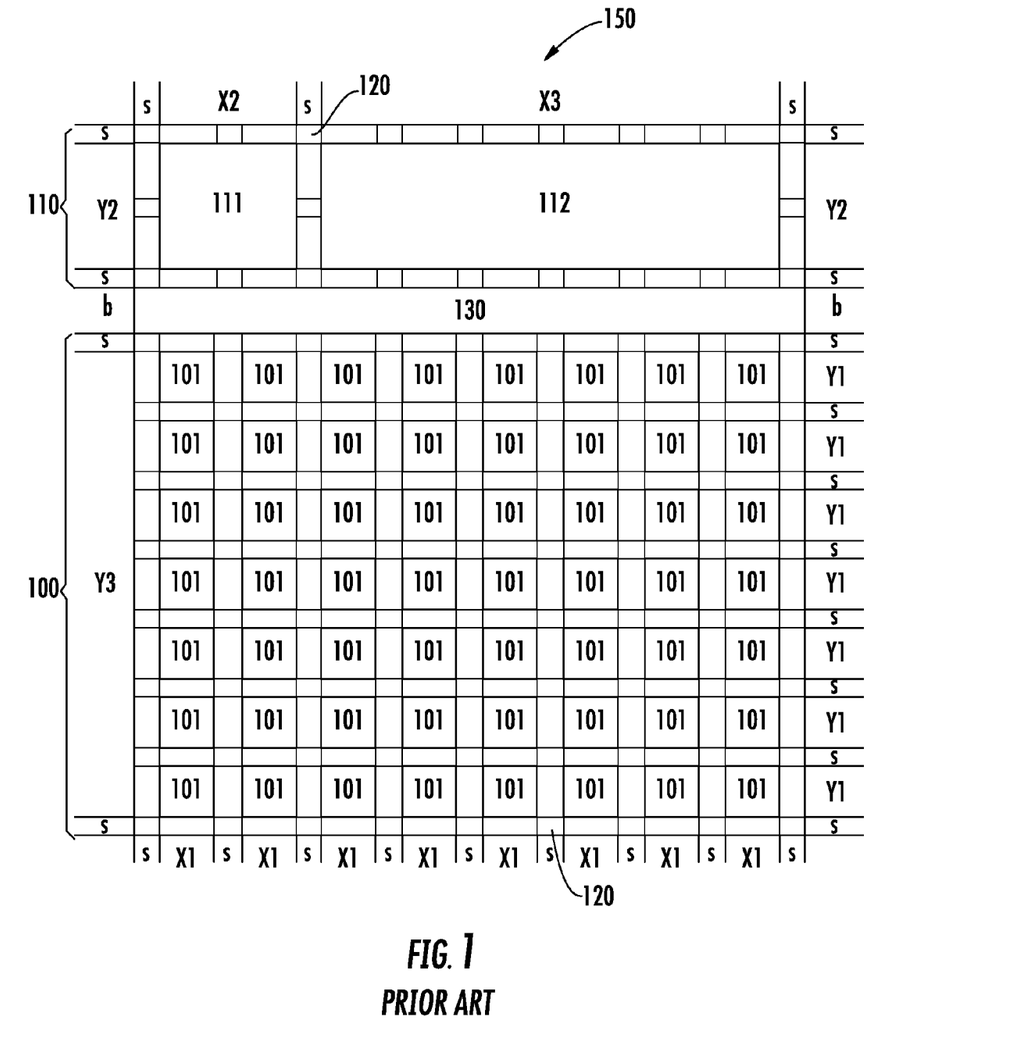
FIG. 1 illustrates a prior art pattern which may be used during the manufacture of ultra-high voltage semiconductor devices.

FIG. 1 illustrates a traditional pattern (also referred to as a "field", "photo shut", or simply "shut") 150 for use in an ultra-high voltage (UHV) semiconductor device manufacturing process. As shown, the pattern 150 may include a second field region 100 comprising an array of dies 101, e.g., chips. Each die 101 may, for example, represent a separate semiconductor device, such as an integrated circuit, processor, chip or the like. As shown, each of the dies 101 are separated by scribe lines 120, along which cuts or breaks may be made in order to separate the dies 101. Also as shown, the pattern 150 may include a first field region 110. First field regions 110 may be provided in patterns to allow space, such as the depicted test region 112, for experimental chips, such as test chips, prototypes or the like so that they may be tested before being manufactured in larger quantities, e.g., before they are included in the main die area 100. As shown, the first field region 110 may also include a monitoring device region 111. As described above, the process monitoring devices used in UHV manufacturing may be too large to fit in the scribe lines 120 and, thus, one or more of these process monitoring devices may be included in the monitoring device region 111.

The process monitoring devices may include devices configured to measure various electrical characteristics of one or more dies 101, as variations in the manufacturing process may cause variations in these electrical characteristics. The traditional pattern 150 may also include a buffer region 130 interposed between the first field region 110 and second field region 100.

Figure 2:
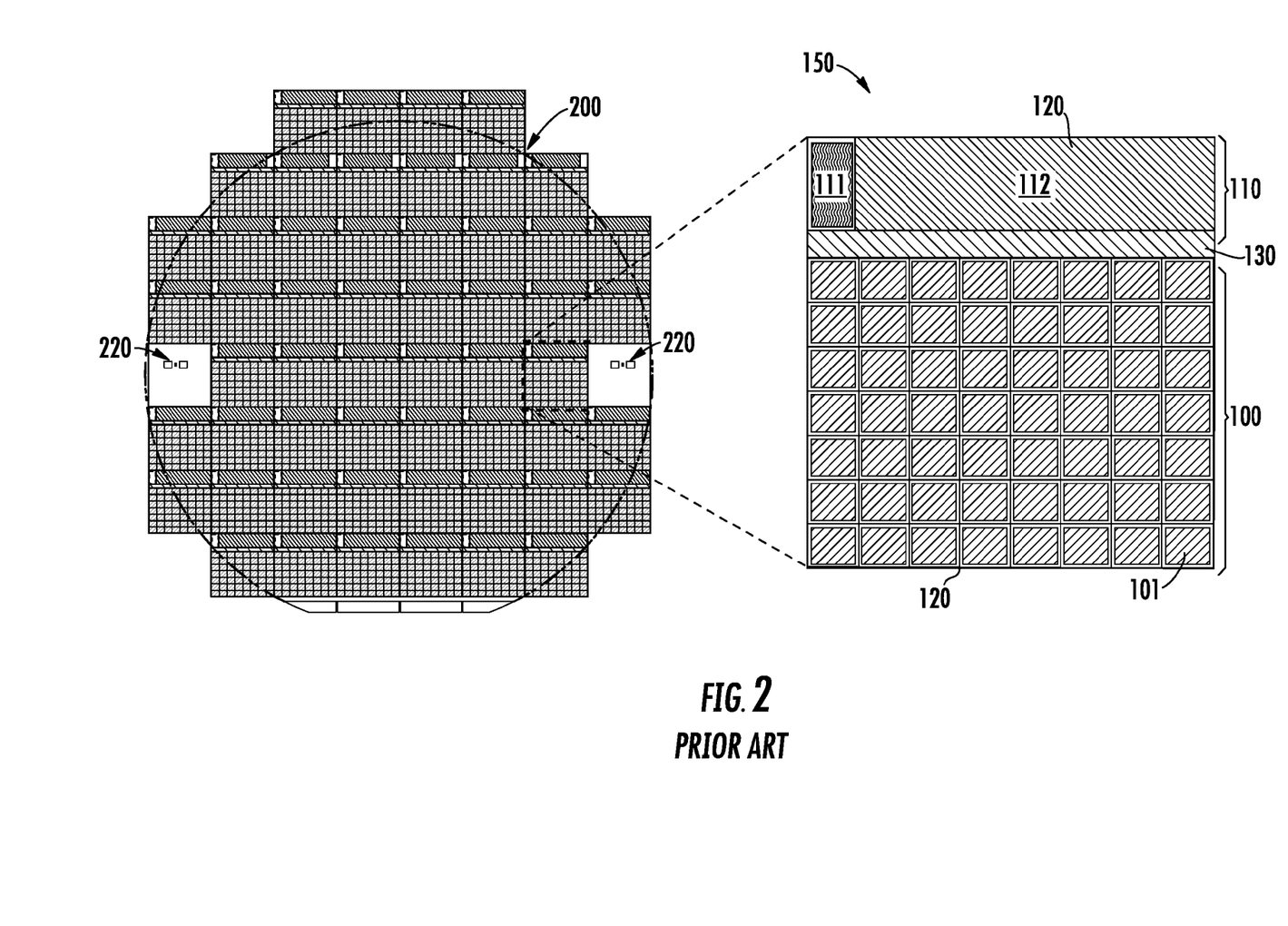
FIG. 2 illustrates the prior art pattern of FIG. 1, as applied to the surface of a wafer.
Figure 3:
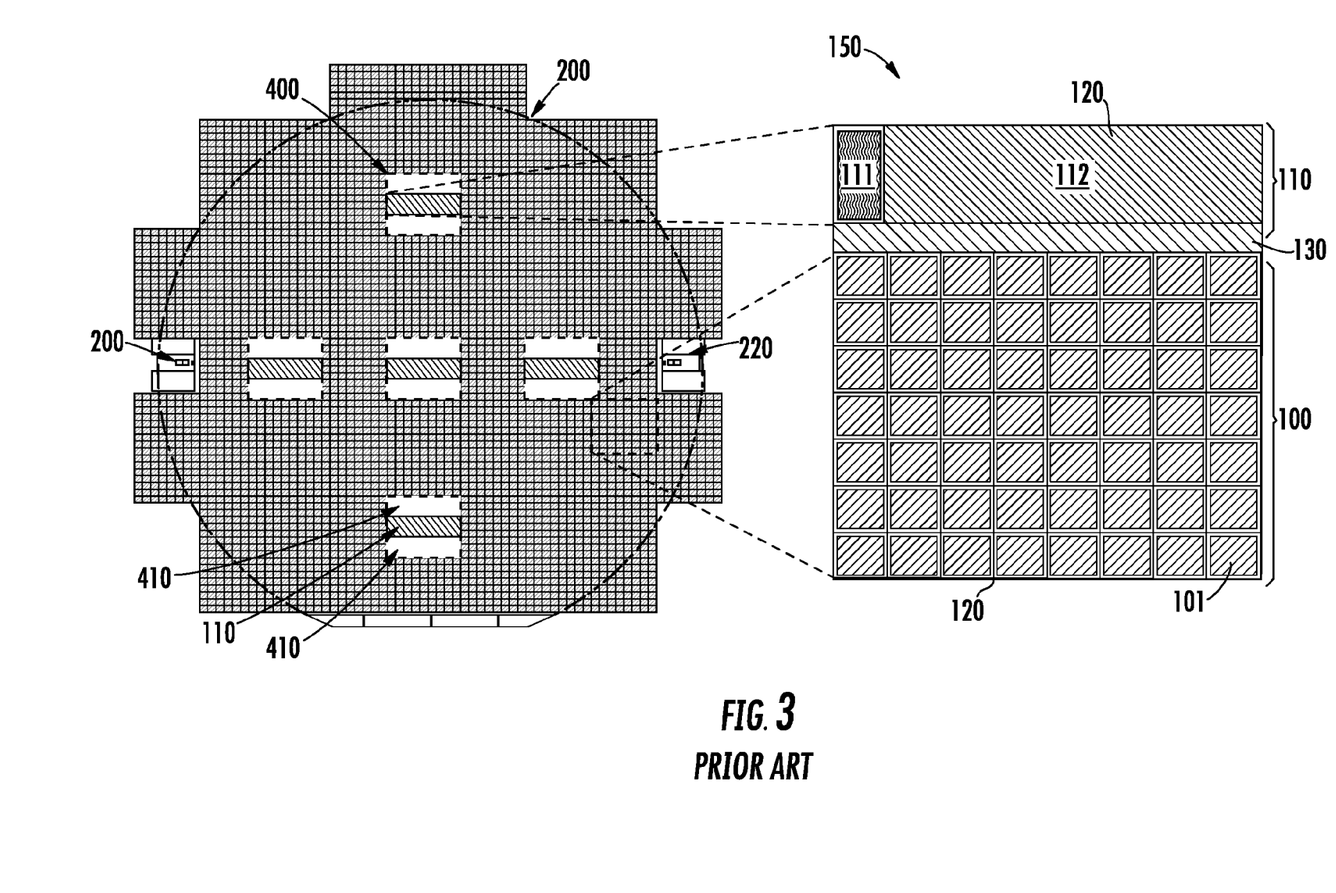
FIG. 3 illustrates the prior art pattern of FIG. 1, as applied with extended first field regions to the surface of a wafer.

FIG. 2 illustrates the pattern 150 depicted in FIG. 1 as applied to the surface of a wafer 200. As shown, in some instances a pattern may be repeated in a tiled fashion across the surface of the wafer. Space may be reserved for alignment keys 220. As can be seen from FIG. 2, the conventional pattern 150 may result in a substantial amount of lost main chip 101 yield due to the first field 110 and buffer 130 regions. FIG. 3 illustrates another variation on the application of the pattern 150 to the surface of the wafer 200. In this case, instead of repeating the entire pattern over the surface of the wafer, the second field region 100 is repeated across almost the entire surface except for one or more (five in the depicted example) extended first field regions 400 which are distributed across the wafer's surface 200. As shown, to entirely cover the surface of the wafer 200 the extended first field regions 400 are made the same height as the second field regions 100 by including unused portions 410 above and/or below the first field region 110. However, the configuration depicted in FIG. 3, also introduces unused portions 410 which not only contribute to yield loss, but also do not contribute to process monitoring.

Figure 4:
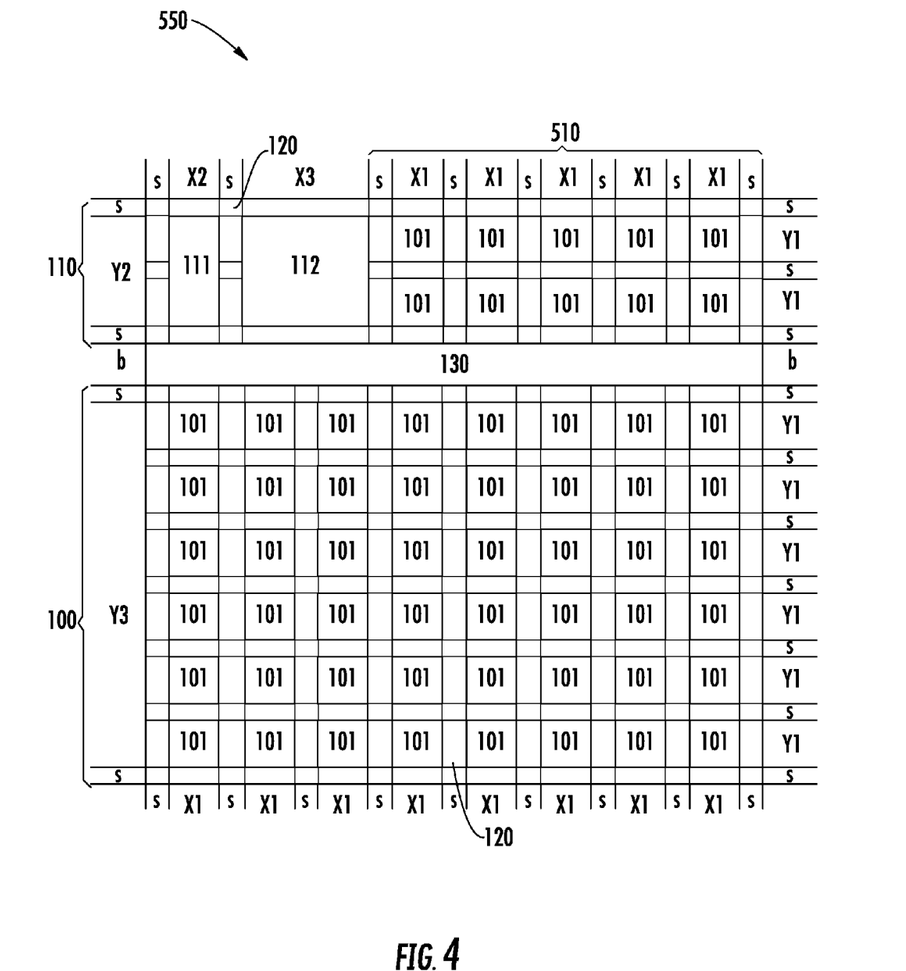
FIG. 4 illustrates a pattern according to an example embodiment of the present invention which may be used during the manufacture of ultra-high voltage semiconductor devices.

Turning now to FIG. 4, a pattern 550 according to an example embodiment of the present invention is depicted. As can be seen, the pattern 550 according to an example embodiment may include a first field region 110 and a second field region 100. The second field region 100 may include a main array of dies 101, each die 101 having a height of $Y_1$ and a width of $X_1$, and the main array 100 itself may have a height of $Y_3$. The first field region 110 may include a monitoring device region 111 having a height of $Y_2$ and a width of $X_2$. The first field region 110 may also include a test region 112 having a height of $Y_2$ and a width of $X_3$. In addition to the monitoring device region 111 and test region 112, the first field region 110 of the example embodiment may also include an auxiliary die region 510 comprising an auxiliary array of dies 101. As shown, the first field region 110 may comprise a plurality of dies extending in the X direction or Y direction or both. Also as shown, example embodiments may also include scribe lines 120 separating each of the various areas and/or components, such as interposed between each row and column of the main and auxiliary arrays, surrounding the second field region 100, surrounding the first field region 110, and interposed between the monitor device region 111, the test region 112, and the auxiliary die region 510. The pattern 550 may also, according to some example embodiments, include a buffer region 130 interposed between the first field region 110 and the second field region 100.

The dimensions of the various regions and/or components of the pattern 550 may, according to an example embodiment, be related to each other in various ways so as to increase efficiency, e.g., yield, when the pattern 550 is applied over the surface of a wafer. For example, given that, as mentioned above, each die 101 has a height of $Y_1$ and a width of $X_1$, the main array 100 has a height of $Y_3$, the monitoring device region 111 has a height of $Y_2$ and a width of $X_2$, and the test region 112 has a height of $Y_2$ and a width of $X_3$, the various dimensions may be related as follows:

$$X_2 = n_1 \times X_1 + \text{adjustment}_1;$$

$$X_3 = n_2 \times X_1 + \text{adjustment}_2;$$

$$Y_2 = n_3 \times Y_1 + \text{adjustment}_3; \text{ and}$$

$Y_3 = n_4 \times Q + \text{adjustment}_4$, with $n_1$, $n_2$, $n_3$, and $n_4$ being integers, and Q being a divisor of $Y_2$. For example, in the example pattern 550 depicted in FIG. 4, $n_1=1$, $n_2=2$, $n_3=2$, $n_4=3$, and $Q=Y_2$. According to a further example embodiment, Q may be a proper divisor of $Y_2$. According to yet another example embodiment, $Y_2$ and $Y_3$ may be relatively prime. That is, $Y_2$ and $Y_3$ may share no common positive divisors except 1.

Thus, the heights and widths of the monitoring region 111, the test region 112, the main die area 100, and the auxiliary die area 510 are each proportional to the heights and widths of the dies 101. Moreover, the height of the first field region 110 is proportional to the height of the second field region 100. According to an example embodiment, the adjustment factors, adjustment$_1$, adjustment$_2$, adjustment$_3$, and adjustment$_4$ may each comprise scribe line adjustment factors. Thus, given that each scribe line 120 has a width of s, the adjustment factors may be defined as follows:

$$\text{adjustment}_1 = (n_1 - 1) \times s,$$

$$\text{adjustment}_2 = (n_2 - 1) \times s,$$

$$\text{adjustment}_3 = (n_3 - 1) \times s, \text{ and}$$

$$\text{adjustment}_4 = (n_4 - 1) \times s.$$

According to other example embodiments, the adjustment factors may adjust for alternative and/or additional spatial considerations.

Figure 5:
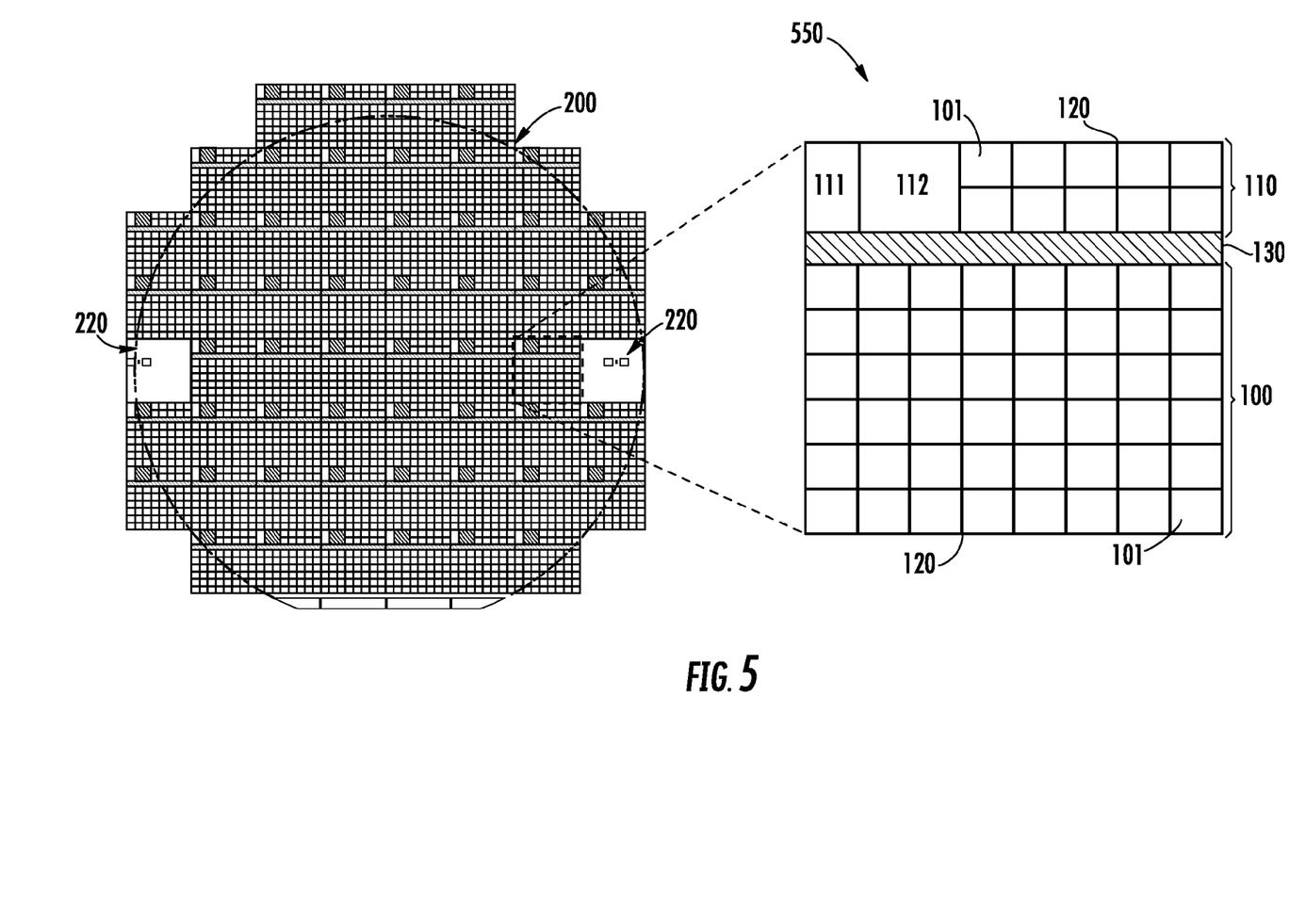
FIG. 5 illustrates the pattern of FIG. 4, as applied to the surface of a wafer according to an example embodiment.

FIG. 5 illustrates the example pattern 550 depicted in FIG. 4 as applied to the surface of a wafer 200 according to an example embodiment. As shown, the pattern 550 may, according to an example embodiment, be repeated in a tiled fashion across the surface of the wafer 200. Space may be reserved for alignment keys 220. As can be seen from FIG. 5, the example pattern 550 may substantially reduce the amount of lost main chip 101 yield due to the first field 110 and buffer 130 regions, as compared to the conventional configuration depicted in FIG. 2.

Figure 6:
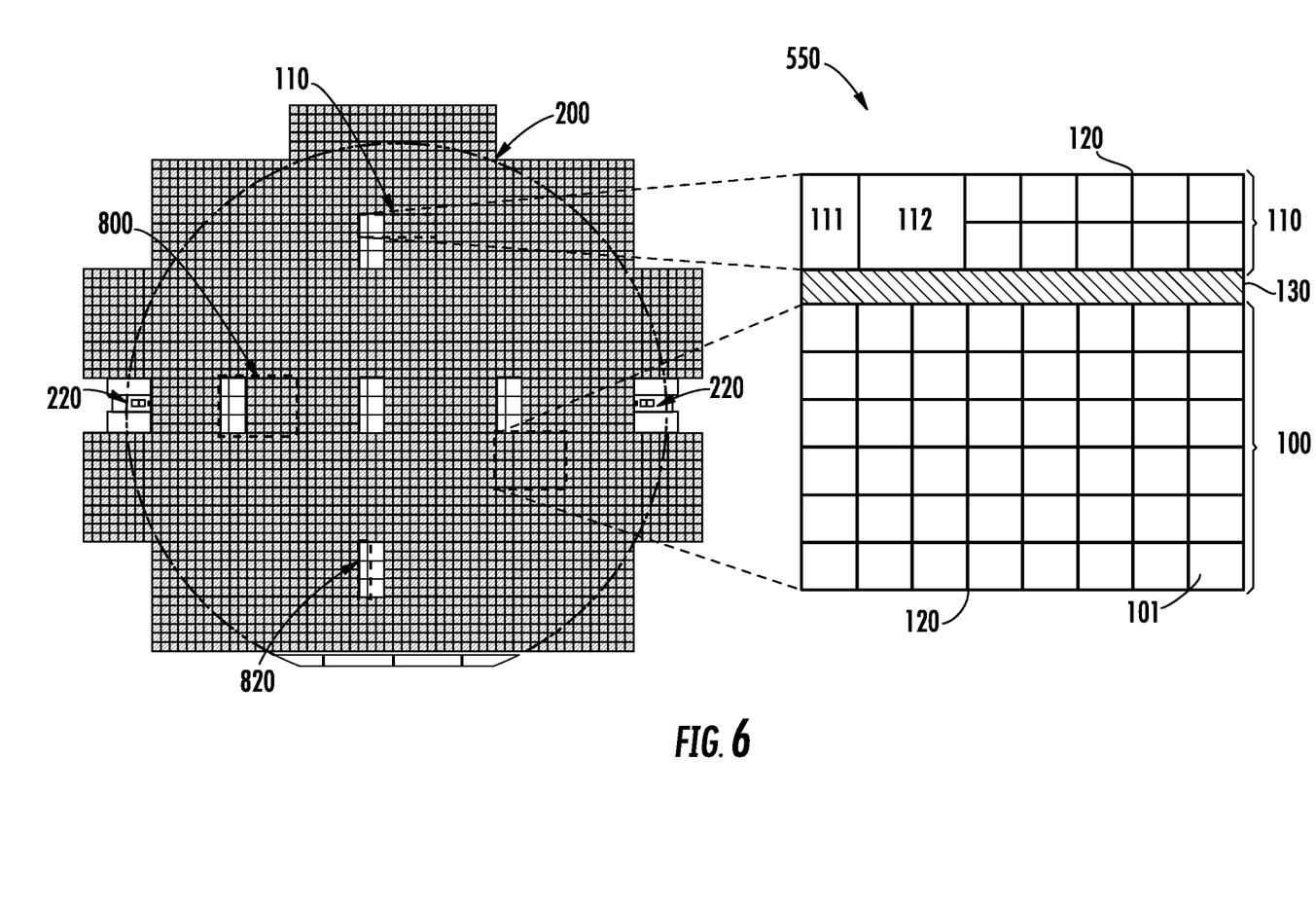
FIG. 6 illustrates the pattern of FIG. 4, as applied with extended first field regions to the surface of a wafer according to an example embodiment.

FIG. 6 illustrates another example of how the pattern 550 may be applied to the surface of the wafer 200 according to an additional example embodiment. In this case, instead of repeating the entire pattern 550 over the surface of the wafer, the second field region 100 is repeated across a portion of the surface along with one or more (five in the depicted example, though any number may be used) extended first field regions 800 which are distributed across the wafer's surface 200. To entirely cover the surface of the wafer 200, the extended first field regions 800 may be made the same height as the second field regions 100. As the height of the second field region 100 is $Y_3 = n_4 \times Y_2 + \text{adjustment}_4$, and the height of the first field region is $Y_2$, an extended first field region 800 including an extended monitoring device region 820 that is the same height as the second field region may be created by aligning $n_4$ first field regions 110 along an axis corresponding to their height. Because the heights of the first field region 110 and the second field region 100 are proportional, there are no unused portions as there were in the conventional configuration depicted in FIG. 3.

Figure 7:
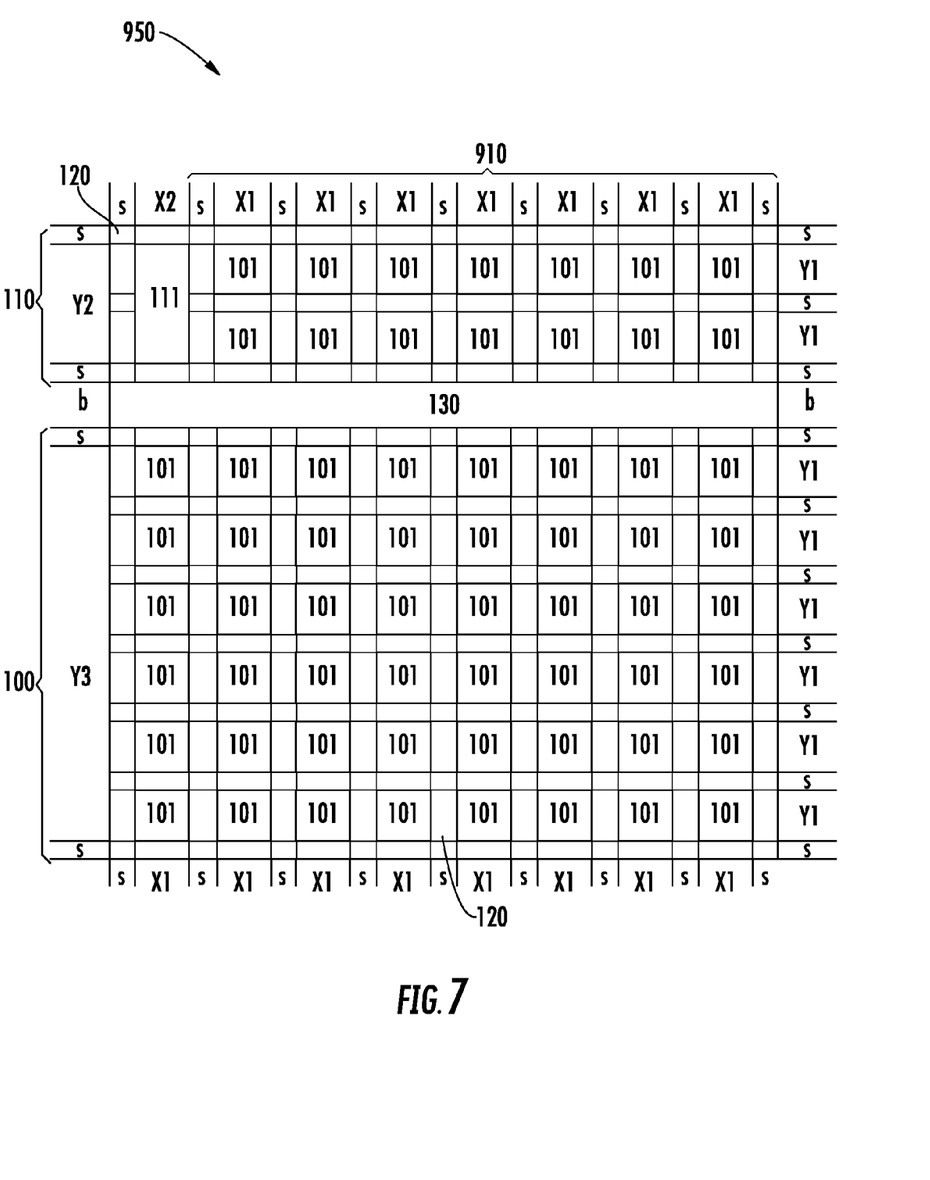
FIG. 7 illustrates a pattern according to an example embodiment of the present invention which may be used during the manufacture of ultra-high voltage semiconductor devices.

Turning now to FIG. 7, a pattern 950 according to another example embodiment of the present invention is depicted. As can be seen, the pattern 950 according to an example embodiment may include a first field region 110 and a second field region 100. The second field region 100 may include a main array of dies 101, each die 101 having a height of $Y_1$ and a width of $X_1$, and the main array 100 itself may have a height of $Y_3$. The first field region 110 may include a monitoring device region 111 having a height of $Y_2$ and a width of $X_2$. The first field region 110 according to this example embodiment excludes the test region 112 depicted in the previous example embodiment. The test region 112 may, for example, be excluded in favor of a larger auxiliary die region 910. As shown, the first field region 110 may comprise a plurality of dies extending in the X direction or Y direction or both. Also as shown, example embodiments may also include scribe lines 120 separating each of the various areas and/or components, such as interposed between each row and column of the main and auxiliary arrays, surrounding the second field region 100, surrounding the first field region 110, and interposed between the monitor device region 111 and the auxiliary die region 910. The pattern 950 may also, according to some example embodiments, include a buffer region 130 interposed between the first field region 110 and the second field region 100.

As with the example pattern 550 depicted in FIG. 4, the dimensions of the various regions and/or components of the pattern 950 may, according to an example embodiment, be related to each other as follows:

$$X_2 = n_1 \times X_1 + \text{adjustment}_1;$$

$$Y_2 = n_3 \times Y_1 + \text{adjustment}_3; \text{ and}$$

$Y_3 = n_4 \times Q + \text{adjustment}_1$, with $n_1$, $n_3$, and $n_4$ being integers, and Q being a divisor of $Y_2$. For example, in the example pattern 950 depicted in FIG. 4, $n_1=1$, $n_3=2$, $n_4=3$, and $Q=Y_2$. According to a further example embodiment, Q may be a proper divisor of $Y_2$. According to yet another example embodiment, $Y_2$ and $Y_3$ may be relatively prime.

Thus, as with the example pattern 550 depicted in FIG. 4, the heights and widths of the monitoring region 111, the test region 112, the main die area 100, and the auxiliary die area 910 of the example pattern 950 depicted in FIG. 7 may each be proportional to the heights and widths of the dies 101. Moreover, the height of the first field region 110 may be proportional to the height of the second field region 100. According to an example embodiment, the adjustment factors, adjustment$_1$, adjustment$_3$, and adjustment$_4$ may each comprise scribe line adjustment factors. Thus, given that each scribe line 120 has a width of s, the adjustment factors may be defined as follows:

$$\text{adjustment}_1 = (n_1 - 1) \times s,$$

$$\text{adjustment}_3 = (n_3 - 1) \times s, \text{ and}$$

$$\text{adjustment}_4 = (n_4 - 1) \times s.$$

According to other example embodiments, the adjustment factors may adjust for alternative and/or additional spatial considerations.

Figure 8:
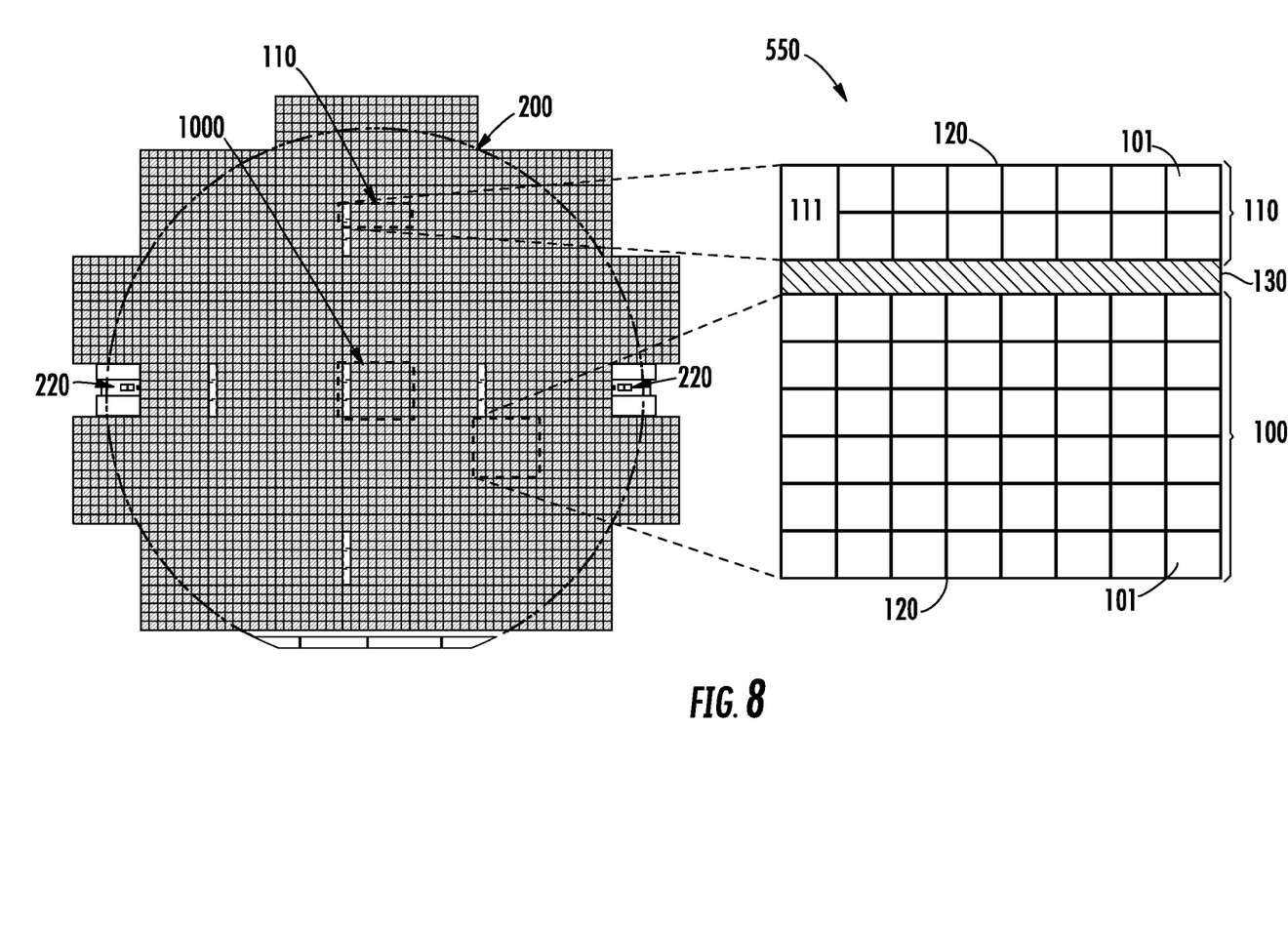
FIG. 8 illustrates the pattern of FIG. 7, as applied with extended first field regions to the surface of a wafer according to an example embodiment.
Figure 9:
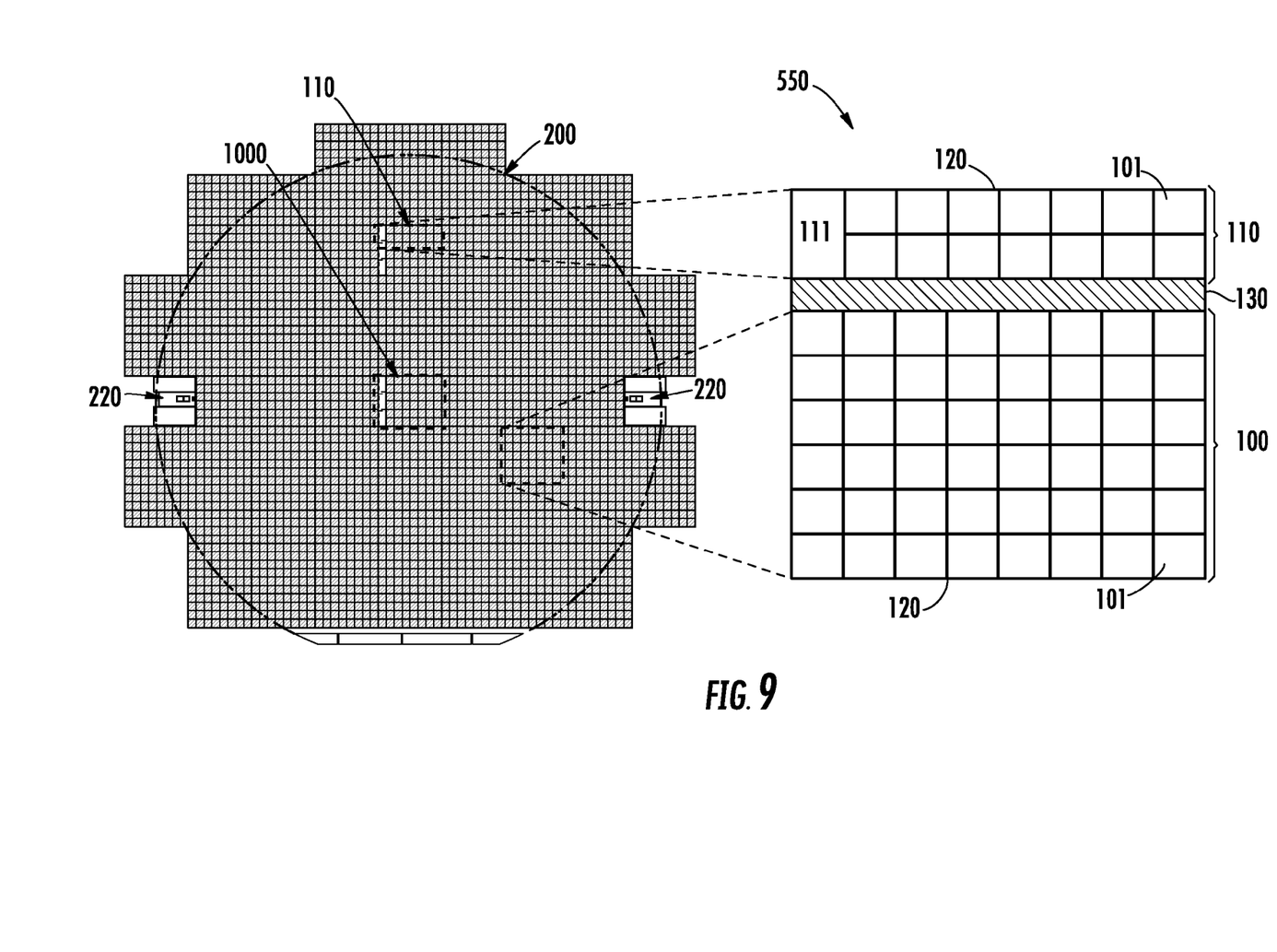
FIG. 9 illustrates the pattern of FIG. 7, as applied with extended first field regions to the surface of a wafer according to an example embodiment.
Figure 10:
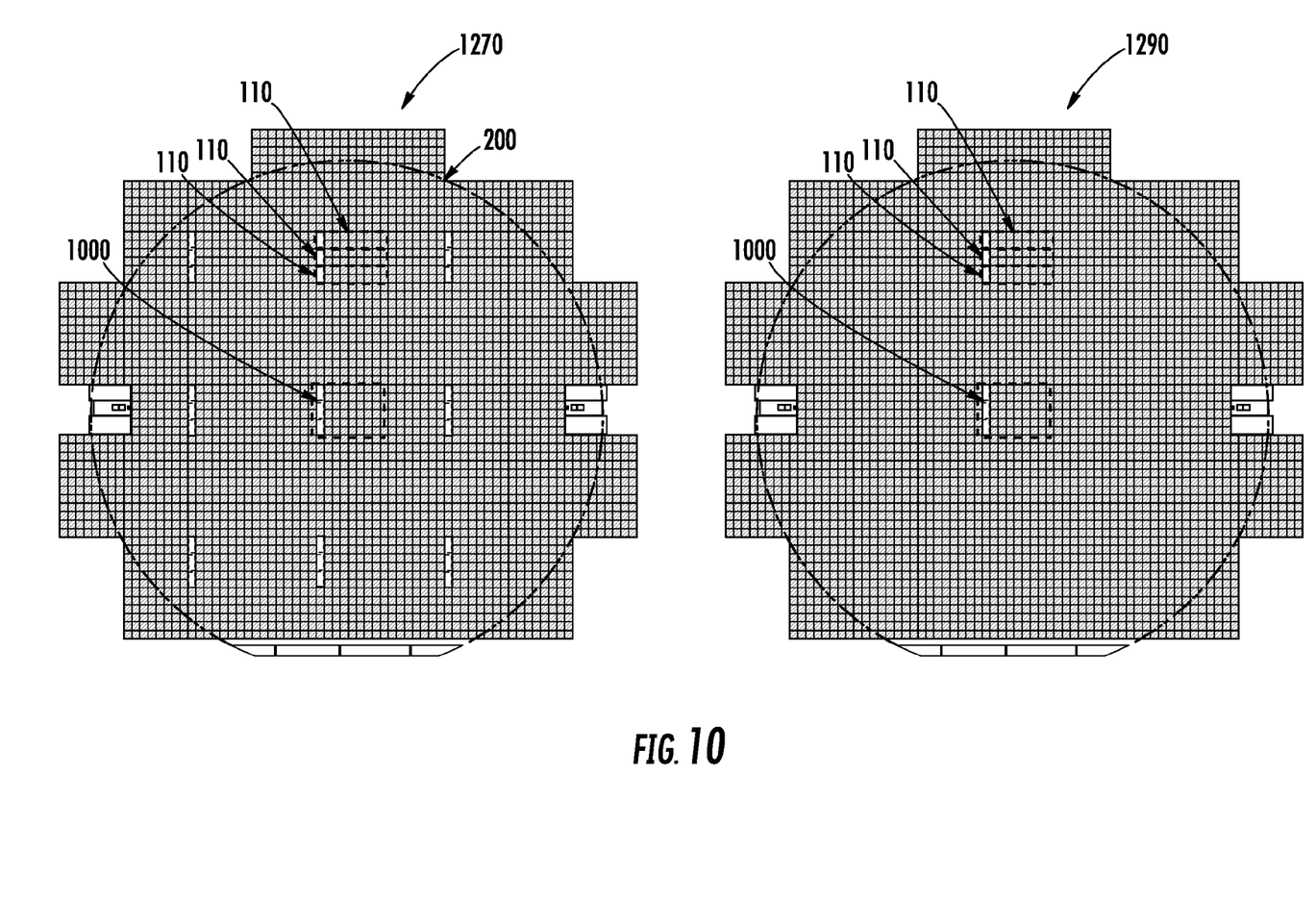
FIG. 10 illustrates a pattern according to an example embodiment of the present invention which may be used during the manufacture of ultra-high voltage semiconductor devices.
Figure 11:
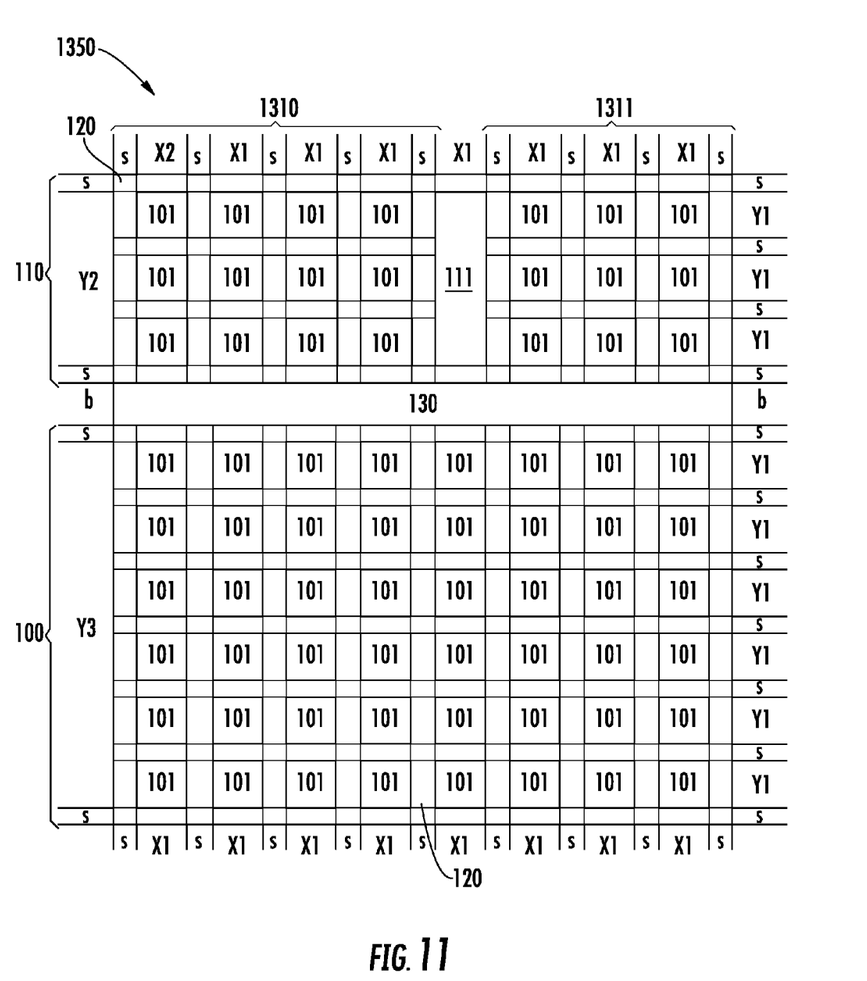
FIG. 11 illustrates two examples of the pattern of FIG. 11, as applied with extended first field regions to the surfaces of two wafers according to example embodiments.

As with the previous example pattern, the pattern 950 depicted in FIG. 7 may, for example, be applied to the surface of a wafer by repeating the pattern 950 in a tiled fashion, such as was depicted in FIG. 5. As shown in FIGS. 10 and 11, the pattern 950 may also, according to an example embodiment, be applied to the surface of a wafer 200 by repeating the second field region 100 across a portion of the surface along with one or more extended first field regions 1000, each extended first field region 1000 including $n_4$ first field regions 110 arranged along an axis corresponding to their height. Any number of extended first field regions may be provided, such as five, as depicted in FIG. 8, or two, as depicted in FIG. 9. The configuration depicted in FIG. 8 may exhibit approximately a 1% yield loss, as compared to the conventional configuration depicted in FIG. 3, which may suffer from a yield loss of approximately 8%.

FIG. 10 depicts two additional example configurations of the example pattern 950 of FIG. 7 as applied across the surface of a wafer 200. As shown, a number of extended first field regions 1000 may be provided over the surface of the wafer 200, each extended first field region 1000 comprising $n_4=3$ first field regions 110 aligned along an axis corresponding to their heights. As shown, the example configuration 1270 on the left contains nine extended first field regions 1000 while the example configuration 1290 on the right contains two. Example configuration 1270 exhibits a yield loss of approximately 1.8%, while example configuration 1290 exhibits a yield loss of approximately 0.2%.

It will be understood that a wide variety of possible configurations may exist according to various example embodiments. For example, any integer numbers may be chosen for $n_1$, $n_2$, $n_3$, and/or $n_4$. As another example, the placement of the monitor device region 111 within the first field region may change.

FIG. 11 depicts such an additional example pattern 1350 having alternative dimensional ratios and a relocated monitor device region 111. As shown, the monitor device region of the example pattern 1350 has a height of $Y_2=n_3 \times Y_1+\text{adjustment}_3$, where $n_3=3$ and the second field region 100 has a height of $Y_3=n_4 \times Y_2+\text{adjustment}_4$, where $n_4=2$. Furthermore, the position of the monitor device region 111 is towards the center of the first field region 110, as opposed to an edge, thus creating a first auxiliary die region 1310 and a second auxiliary die region 1311. Were a test region 112 also included, it could be possible to subdivide the first field region even further, creating additional auxiliary die regions.

Example embodiments may therefore provide various patterns for use in the manufacture of semiconductor devices which allow for flexible configurations and decreased yield loss. Patterns according to example embodiments may be beneficially employed in manufacturing contexts in which one or more monitoring devices will not fit in the scribe lines. Thus, patterns according to example embodiments may, for example, be of particular benefit in the manufacturing of UHV semiconductor devices.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed:

1. A semiconductor device comprising:
   at least one second field region comprising a main array of dies, each of the dies having a height of $Y_1$ and a width of $X_1$, and the main array having a height of $Y_3$; and
   at least one first field region comprising:
   a monitoring region having a height of $Y_2$ and a width of $X_2$, and
   an auxiliary die region comprising an auxiliary array of dies;
   wherein:

$X_2 = n_1 \times X_1 + \text{adjustment}_1$;

$Y_2 = n_3 \times Y_1 + \text{adjustment}_3$;

$Y_3 = n_4 \times Q + \text{adjustment}_4$;

$n_1$, $n_3$, and $n_4$ are integers; and
   Q is a divisor of $Y_2$; and
   further wherein the heights comprise respective measurements made in a first direction in a plane of the semiconductor device and the widths comprise respective measurements made in a second direction in the plane of the semiconductor device, the second direction being orthogonal to the first.

2. The semiconductor device of claim 1, wherein Q is a proper divisor of $Y_2$.

3. The semiconductor device of claim 1, wherein $Q=Y_2$.

4. The semiconductor device of claim 1, wherein $Y_2$ and $Y_3$ are relatively prime.

5. The semiconductor device of claim 1, wherein the first field region comprises a plurality of dies, the plurality of dies extending in at least one of the first direction or the second direction.

6. The semiconductor device of claim 1, further comprising a plurality of scribe lines interposed at least between each row and column of the main and auxiliary die arrays, each scribe line having a width of s, wherein:

$\text{adjustment}_1 = (n_1-1) \times s$, $\text{adjustment}_3 = (n_3-1) \times s$, and $\text{adjustment}_4 = (n_4-1) \times s$.

7. The semiconductor device of claim 1, wherein the first field region further comprises a test chip region having a height of $Y_2$ and a width of $X_3$, wherein $X_3=n_2 \times X_1+\text{adjustment}_2$ and $n_2$ is an integer.

8. The semiconductor device of claim 1, further comprising $n_4-1$ additional first field regions, the first field regions being arranged adjacent to one another along an axis corresponding to their respective heights so as to form an extended first field region, the extended first field region comprising an extended monitor region having a height of $Y_3$ and an extended auxiliary die region having a height of $Y_3$.

9. The semiconductor device of claim 8, wherein the extended first field region comprises a first extended first field region, the semiconductor device further comprising at least a second extended first field region, the first and second extended first field regions being arranged along an axis corresponding to their heights.

10. The semiconductor device of claim 9, further comprising third, fourth, and fifth extended first field regions, the third extended first field region being arranged along the axis corresponding to the heights of the first and second extended first field regions, and the fourth and fifth extended first field regions being arranged on either side of the second extended first field region and along an axis corresponding to respective widths of the second, fourth, and fifth extended first field regions.

11. A photomask configured to be used during a photolithographic semiconductor device manufacturing process, the photomask being further configured to cause projection at least of:

at least one second field region comprising a main array of dies, each of the dies having a height of $Y_1$ and a width of $X_1$, and the main array having a height of $Y_3$; and at least one first field region comprising:
- a monitoring region having a height of $Y_2$ and a width of $X_2$, and
- an auxiliary die region having a height of $Y_2$ and comprising an auxiliary array of dies;

wherein:

$$X_2 = n_1 \times X_1 + \text{adjustment}_1;$$

$$Y_2 = n_3 \times Y_1 + \text{adjustment}_3;$$

$$Y_3 = n_4 \times Q + \text{adjustment}_4;$$

$n_1$, $n_3$, and $n_4$ are integers; and
Q is a divisor of $Y_2$; and further wherein the heights comprise respective measurements made in a first direction in a plane of the photomask and the widths comprise respective measurements made in a second direction in the plane of the photomask, the second direction being orthogonal to the first.

12. The photomask of claim 11, wherein Q is a proper divisor of $Y_2$.

13. The photomask of claim 11, wherein $Q=Y_2$.

14. The photomask of claim 11, wherein $Y_2$ and $Y_3$ are relatively prime.

15. The photomask of claim 11, wherein the photomask is further configured to cause projection of a plurality of scribe lines interposed at least between each row and column of the main and auxiliary die arrays, each scribe line having a width of s, wherein:

$$\text{adjustment}_1 = (n_1 - 1) \times s,$$

$$\text{adjustment}_3 = (n_3 - 1) \times s, \text{ and}$$

$$\text{adjustment}_4 = (n_4 - 1) \times s.$$

16. The photomask of claim 11, wherein the first field region further comprises a test chip region having a height of $Y_2$ and a width of $X_3$, wherein $X_3 = n_2 \times X_1 + \text{adjustment}_2$ and $n_2$ is an integer.

17. The photomask of claim 11, wherein the photomask is further configured to cause projection of $n_4 - 1$ additional first field regions, the first field regions being arranged adjacent to one another along an axis corresponding to their respective heights so as to form an extended first field region, the extended first field region comprising an extended monitor region having a height of $Y_3$ and an extended auxiliary die region having a height of $Y_3$.

18. The photomask of claim 17, wherein the extended first field region comprises a first extended first field region, the photomask being further configured to cause projection of at least a second extended first field region, the first and second extended first field regions being arranged along an axis corresponding to their heights.

19. The photomask of claim 18, the photomask being further configured to cause projection of at least third, fourth, and fifth extended first field regions, the third extended first field region being arranged along the axis corresponding to the heights of the first and second extended first field regions, and the fourth and fifth extended first field regions being arranged on either side of the second extended first field region and along an axis corresponding to respective widths of the second, fourth, and fifth extended first field regions.

20. A method of manufacturing a semiconductor device, the method comprising applying light in a particular pattern to at least a portion of a substrate, the particular pattern comprising:

at least one second field region comprising a main array of dies, each of the dies having a height of $Y_1$ and a width of $X_1$, and the main array having a height of $Y_3$; and at least one first field region comprising:
- a monitoring region having a height of $Y_2$ and a width of $X_2$, and
- an auxiliary die region comprising an auxiliary array of dies;

wherein:

$$X_2 = n_1 \times X_1 + \text{adjustment}_1;$$

$$Y_2 = n_3 \times Y_1 + \text{adjustment}_3;$$

$$Y_3 = n_4 \times Q + \text{adjustment}_4; \text{ and}$$

$n_1$, $n_3$, and $n_4$ are integers; and
Q is a divisor of $Y_2$; and further wherein the heights comprise respective measurements made in a first direction in a plane of the substrate and the widths comprise respective measurements made in a second direction in the plane of the substrate, the second direction being orthogonal to the first.

* * * * *